(12) United States Patent
Mauritzson

(10) Patent No.: US 9,871,068 B1
(45) Date of Patent: Jan. 16, 2018

(54) METHODS AND APPARATUS FOR AN IMAGE SENSOR WITH A MULTI-BRANCH TRANSISTOR

(71) Applicant: SEMICONDUCTOR COMPONENTS INDUSTRIES, LLC, Phoenix, AZ (US)

(72) Inventor: Richard Mauritzson, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/242,326

(22) Filed: Aug. 19, 2016

(51) Int. Cl.
*H01L 27/146* (2006.01)
*H04N 5/378* (2011.01)

(52) U.S. Cl.
CPC .... *H01L 27/14616* (2013.01); *H01L 27/1461* (2013.01); *H01L 27/14689* (2013.01); *H04N 5/378* (2013.01)

(58) Field of Classification Search
CPC ........... H01L 27/1461; H01L 27/14614; H01L 27/14616
See application file for complete search history.

(56) References Cited

PUBLICATIONS

Lin et al., Simulation of the Multi-Source/Drain SOI MOSFET, 2008 15th International Symposium on the Physical and Failure Analysis of Integrated Circuits, Singapore, Jul. 2008, pp. 1-4, IEEE.

*Primary Examiner* — Amar Movva
(74) *Attorney, Agent, or Firm* — The Noblitt Group, PLLC; Hettie L. Haines

(57) ABSTRACT

Various embodiments of the present technology may comprise a method and device for a multi-source/drain transistor for use in an image sensor. The device may comprise an active region, wherein the active region comprises three doped regions. Two of the three doped region may be floating diffusion active regions, wherein each floating diffusion active region is connected to a photosensitive element. The device may comprise a multi-branch channel defined by the area underlying a gate region and substantially surrounded by the doped regions. During operation the electron path may form an "L" shape within the channel.

14 Claims, 8 Drawing Sheets

METHODS AND APPARATUS FOR AN IMAGE SENSOR WITH A MULTI-BRANCH TRANSISTOR

BACKGROUND OF THE TECHNOLOGY

Transistors are commonly utilized in the manufacture and fabrication of image sensors. Image sensors may comprise any number of photodiodes, and these photodiodes may share some or all of the readout circuitry to reduce the number of devices and cost of the image sensor. The photodiodes may also share a reset transistor. Due to design constraints, however, multiple reset transistors may be needed. Multiple transistors utilize larger areas of the chip, which reduces the photodiode area, and in turn reduces the fill factor. Other designs and placement of the reset transistor may increase the active area of the floating diffusion region, which adversely affects the conversion gain.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates an imaging system in accordance with an exemplary embodiment of the present technology;

Figure 4:
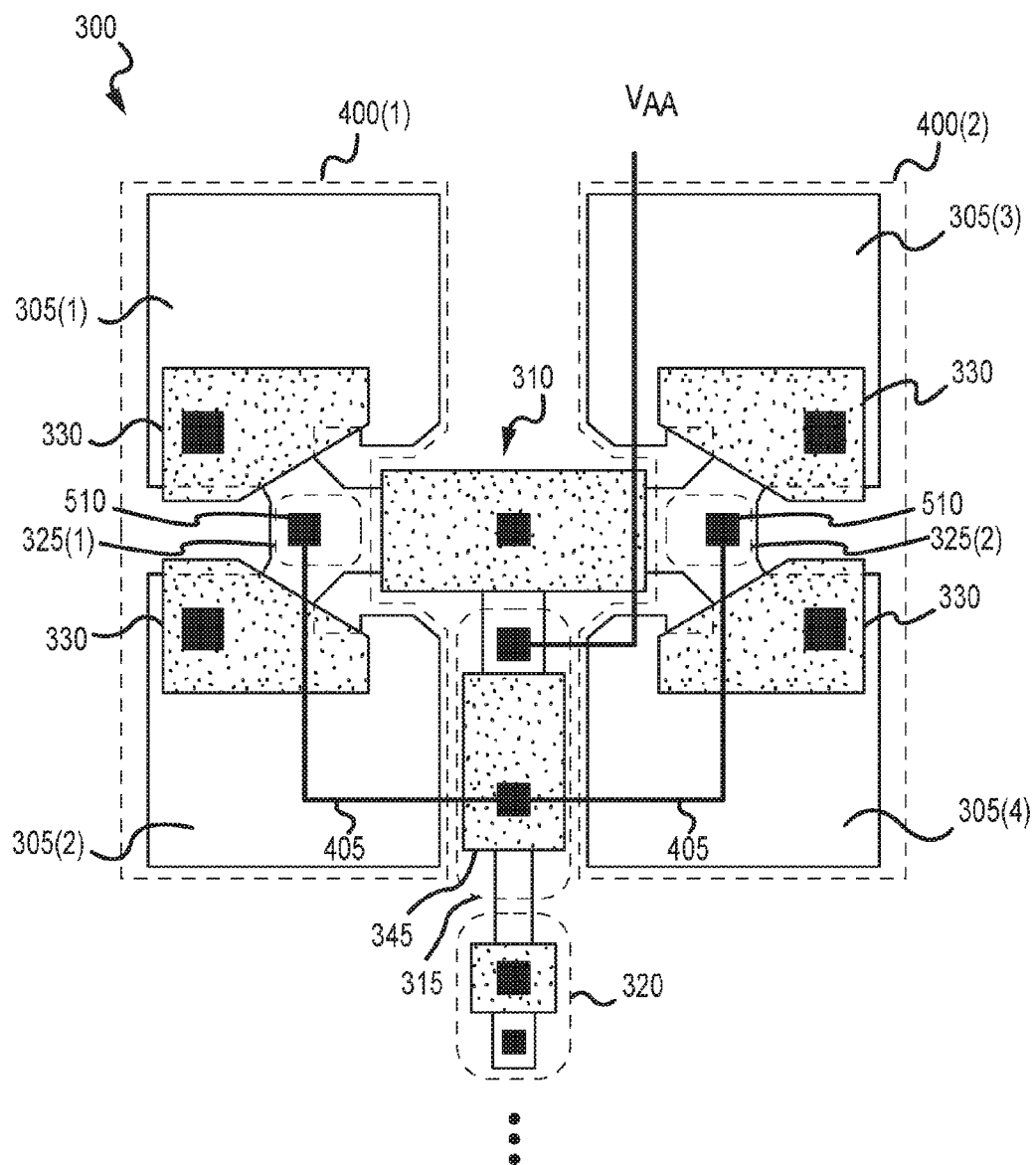
Figure 5:
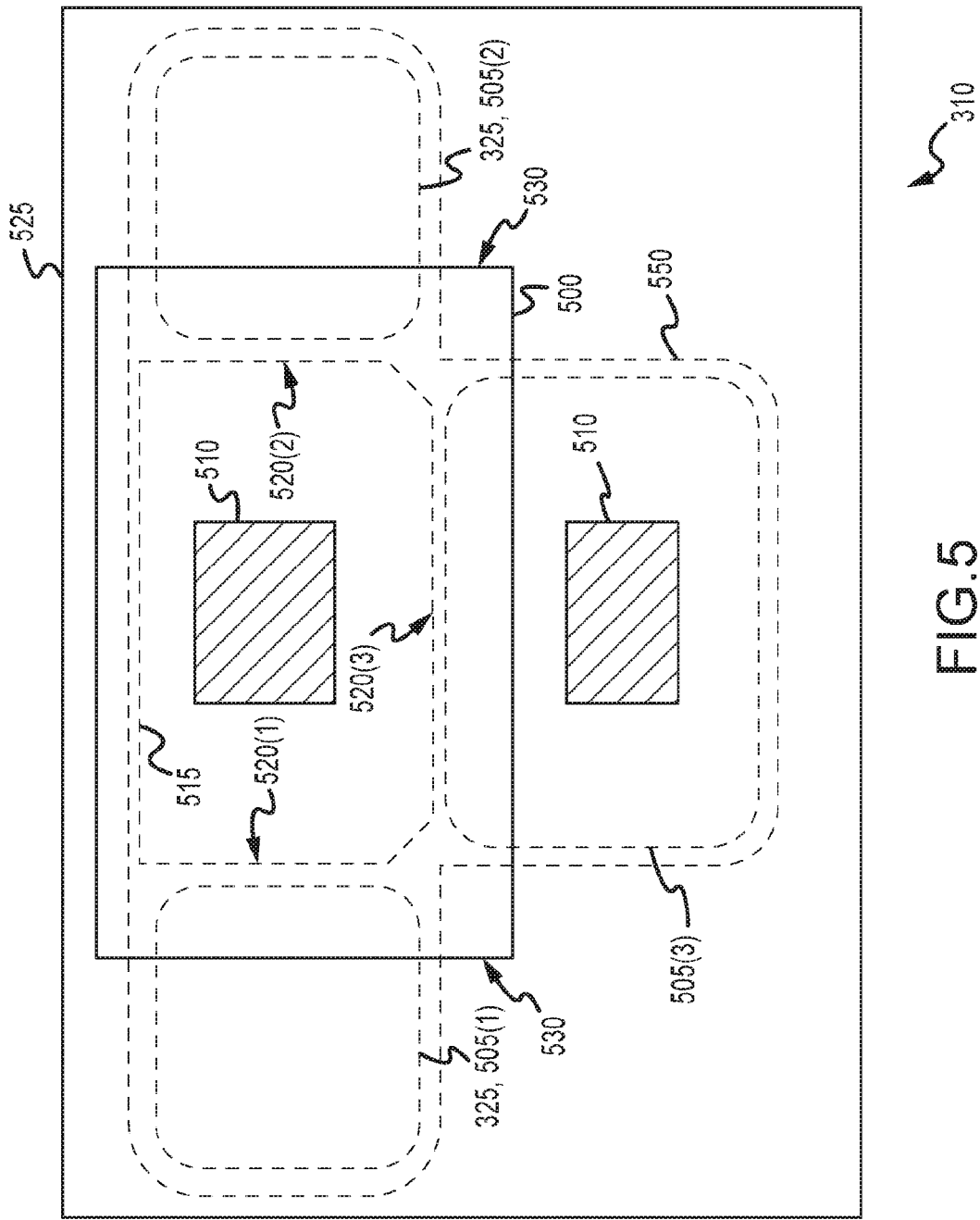

FIG. 4 representatively illustrates a device layout in accordance with an exemplary embodiment of the present technology;

FIG. 5 representatively illustrates a transistor layout in accordance with an exemplary embodiment of the present technology; and FIGS. 6A-6G representatively illustrate fabrication of a device in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various semiconductor devices, such as transistors, capacitors, and the like, which may carry out a variety of functions. In addition, the present technology may be practiced in conjunction with any number of imaging systems and the apparatus described is merely one exemplary application for the technology. Further, the present technology may employ any number of conventional techniques for capturing image data, sampling image data, readout of image data, and the like.

Methods and apparatus for a transistor according to various aspects of the present technology may operate in conjunction with any suitable system where a multi-source/drain transistor can be utilized. Further, methods and apparatus for the transistor may operate in conjunction with any suitable imaging system, such as a camera system, video system, machine vision, vehicle navigation, surveillance system, motion detection system, image stabilization system, and the like.

Figure 1:
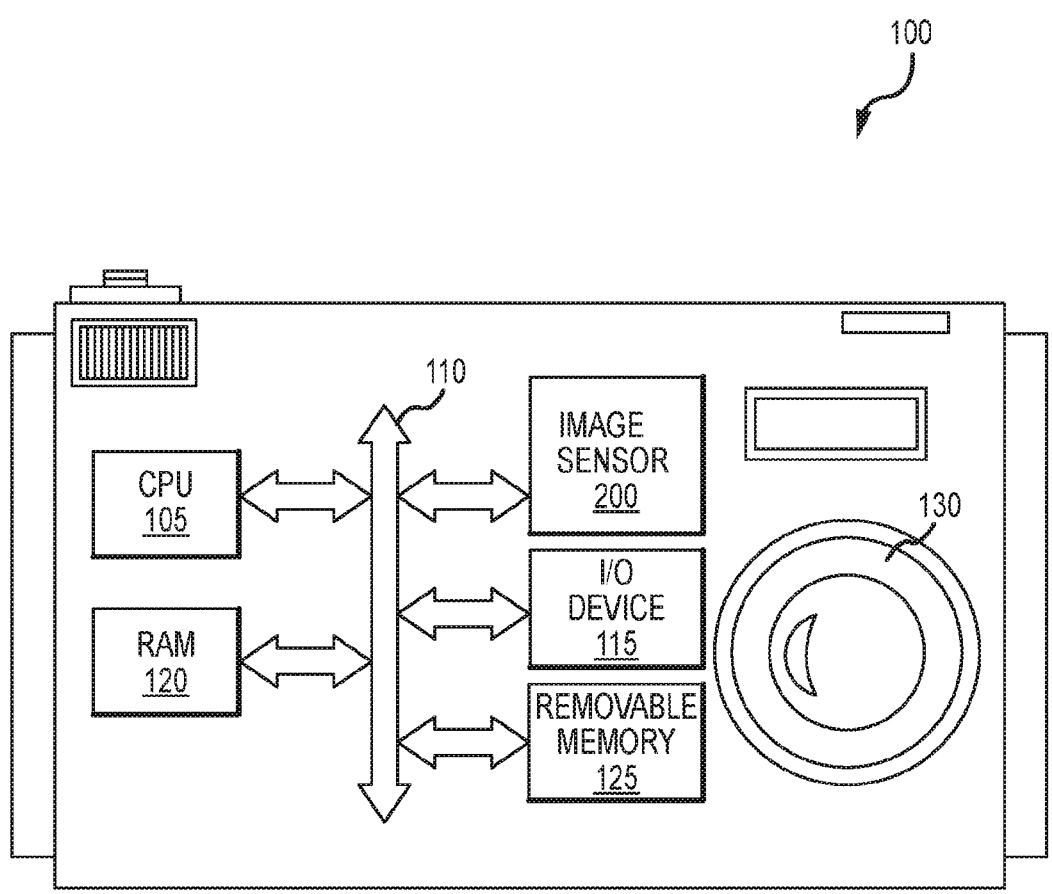

Referring to FIG. 1, an exemplary imaging system may comprise an electronic device, such as a digital camera 100. In one embodiment, the imaging system may comprise a central processing unit (CPU) 105 that communicates with various devices over a bus 110. Some of the devices connected to the bus 110 may provide communication into and out of the system, for example an input/output (I/O) device 115. Other devices connected to the bus 110 provide memory, for example, a random access memory (RAM) 120, hard drive, and one or more peripheral memory devices 125, such as a floppy disk drive, compact disk (CD) drive, USB drives, memory cards and SD cards. While the bus 110 is illustrated as a single bus, any number of busses may be used to provide communication paths to interconnect the devices.

The imaging system may further comprise an image sensor 200 for capturing image data. For example, light may enter the imaging system through a lens 130 and strike the image sensor 200. In various embodiments, the lens 135 may be configured to focus an image. For example, the lens 135 may include a fixed and/or adjustable lens and may include micro lenses formed on a surface of the imaging device 145.

The image sensor 200 may detect and convey the information that constitutes an image, for example by converting the variable attenuation of waves (as they pass through or reflect off objects) into electronic signals. The image sensor 200 may be implemented in conjunction with any appropriate technology, such as using semiconductor charge-coupled devices (CCD), active pixel sensors in complementary metal-oxide-semiconductors (CMOS) or N-type metal-oxide-semiconductors (NMOS, Live MOS), analog sensors, and/or flat panel detectors.

The image sensor 200 may be combined with a processor, such as the CPU 105, a digital signal processor, or a microprocessor, in a single integrated circuit, or may be formed on a separate chip. The imaging system may also receive control or other data from the system, such as a shutter release. In the present exemplary embodiment, the image sensor 200 may be formed in silicon using any suitable technology and/or fabrication process.

Figure 2:
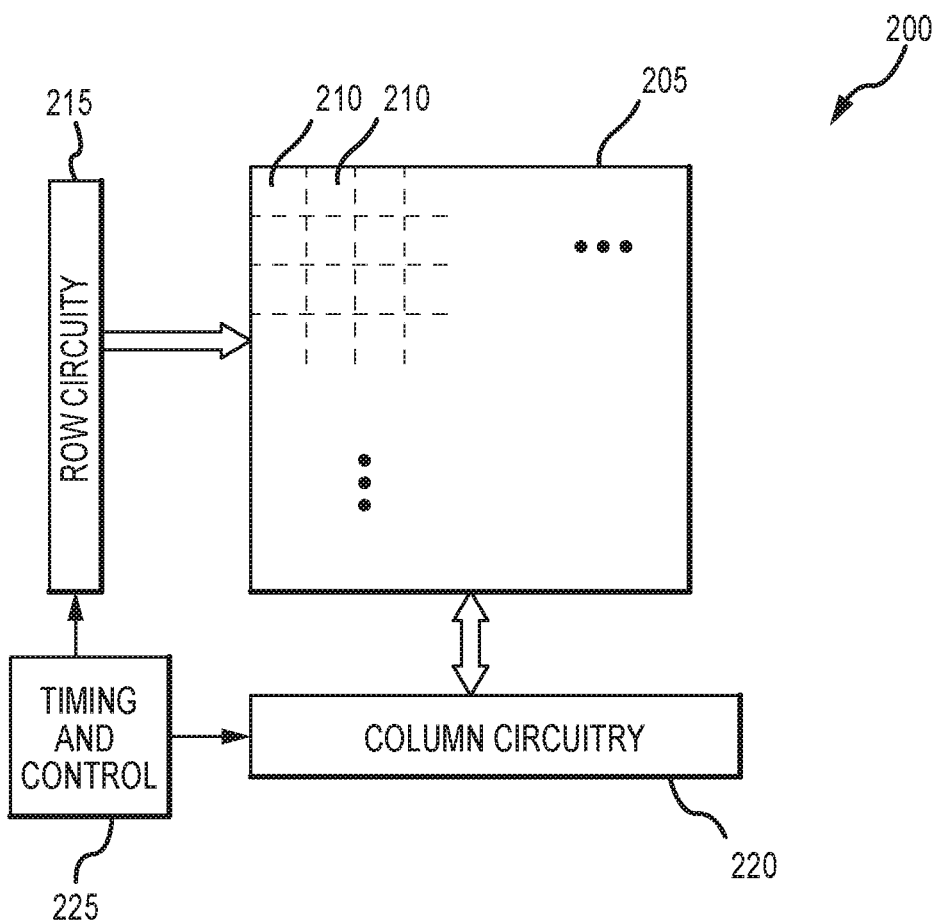
FIG. 2 is a block diagram of an image sensor in accordance with an exemplary embodiment of the present technology.

Referring to FIG. 2, in an exemplary embodiment, the image sensor 200 may comprise a pixel array 205 formed from a plurality of pixels 210 arranged in rows and columns. The pixels 210 may be electrically connected via metal wirings or other suitable connections. In various embodiments, a color filter array (not shown) may be disposed on a surface of the pixel array 205. In various embodiments, the image sensor 200 may further comprise row circuitry 215, column circuitry 220, and a timing and control unit 225, for selectively activating sequential rows of pixels to be read out.

Figure 3:
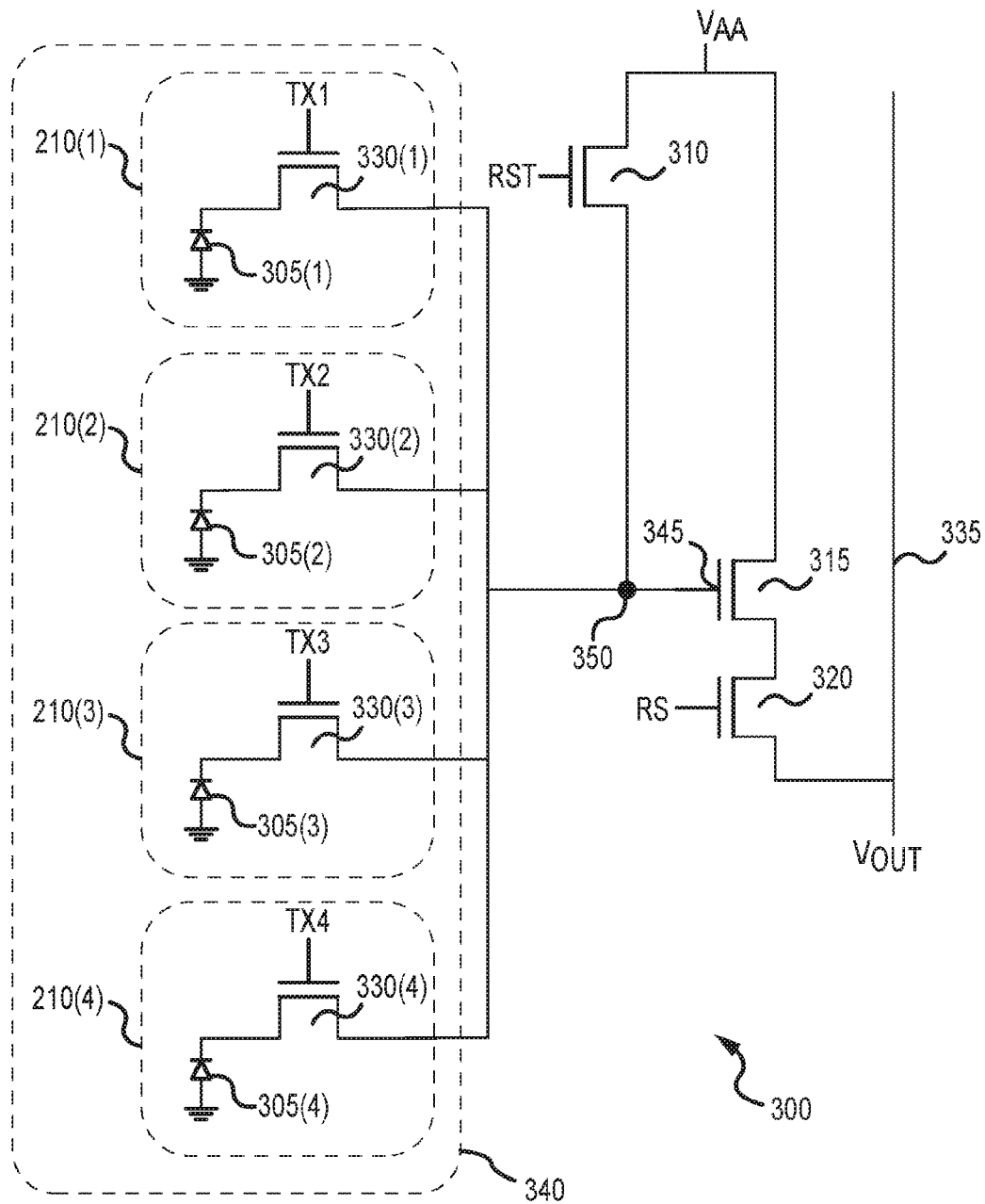
FIG. 3 is a schematic of a 4-way shared pixel configuration in accordance with an exemplary embodiment of the present technology.

Referring to FIG. 3, in an exemplary embodiment of the present technology, the image sensor 200 may comprise a multi-way shared pixel architecture 300. The multi-way shared pixel architecture 300 may comprise a subgroup 340 of pixels 210, for example pixels 210(1), 210(2), 210(3), 210(4) may be defined as one subgroup 340, wherein the subgroup 340 of pixels 210(1), 210(2), 210(3), 210(4) share a readout circuit, as opposed to each individual pixel 210 having its own dedicated readout circuit. In one embodiment, the subgroup 340 may comprise four (4) pixels 210 (i.e., four-way shared pixel architecture). The multi-way shared architecture may comprise, however, any number of pixels 210 suitable for a particular application.

The readout circuit reads information from the pixels for processing to render the image. In an exemplary embodiment, the readout circuit may comprise a reset transistor 310, a floating diffusion node 350, an amplifier 315, and a row select gate 320. A subgroup 340 comprising multiple pixels, such as four pixels 210(1), 210(2), 210(3), 210(4), may share the reset transistor 310, the amplifier 315, and the row select gate 320. In various embodiments, the image sensor 200 may comprise any number of subgroups 340 according to a particular application, design specification, and/or environment of the image sensor 200. Likewise, any suitable number of pixels 210 may share other elements, such as the reset transistor 310, floating diffusion node 350, amplifier 315, and row select gate 320.

In an exemplary embodiment, each pixel 210 may comprise a photosensitive element 305. The photosensitive element 305 operates by converting light into an electric charge and may comprise, for example, a photodiode, a photogate, or any other semiconductor device responsive to light. In various embodiments, the photosensitive element 105 may comprise a pinned photodiode capable of being fully depleted at a depletion voltage.

In various embodiments, each pixel 210 may further comprise a transfer gate 330. The photosensitive element 305 may be selectively coupled to the readout circuit via the transfer gate 330. In an exemplary embodiment, the transfer gate 330 may comprise a transistor having a gate terminal, a drain terminal, and a source terminal, wherein the gate terminal may be used as a control terminal and the source and drain terminals are used to carry current or transfer charge. For example, the gate terminal of the transfer gate 330 may receive a control signal TX from a control unit (not shown). In other embodiments, the first transfer gate 330 may comprise any other suitable device for providing current flow or charge transfer.

The floating diffusion node 350 may comprise a high-conductivity doped region without an ohmic connection into or from which electric charges are transferred. The floating diffusion node 350 may act as a sensing node and may be formed with any device or structure suitable for storing electric charge, such as a diode or capacitor. The floating diffusion node 350 may be connected to the reset transistor 310 for resetting the floating diffusion node 350.

The reset transistor 310 may comprise a gate terminal, a drain terminal, and a source terminal, wherein the gate terminal may be used as a control terminal and the source and drain terminals are used to carry current. For example, the gate terminal of the reset transistor 310 may receive a control signal RST from a control unit (not shown). In an exemplary embodiment, the terminal coupled to a voltage source $V_{AA}$ may be defined as the drain terminal.

In an exemplary embodiment, the amplifier 315 may comprise a source follower circuit designed using a transistor having a gate terminal 345, a drain terminal, and a source terminal. The row select gate 320 may also comprise a transistor having a gate terminal, a drain terminal, and a source terminal, wherein the gate terminal may be used as a control terminal and the source and drain terminals are used to carry current. The gate terminal of the row select gate 320 may receive a control signal RS from the control unit. In an exemplary embodiment, the source terminal of the amplifier 315 may couple to the drain terminal of the row select gate 320, and the source terminal of the row select gate 320 may be coupled to an output bus 335 to transmit an output voltage Vout.

Referring to FIG. 4, in an exemplary embodiment, a layout of the multi-way shared pixel architecture 300 may comprise the subgroup 340 of pixels 210, wherein the subgroup 340 may be divided, such that a first portion 400(1) of the subgroup 340 may be coupled to a first floating diffusion active region 325(1) and second portion 400(2) may be coupled to a second floating diffusion active region 325(2).

In various embodiments, each portion 400 may comprise any number of pixels 210 and/or photosensitive elements 305, for example, each portion may comprise one pixel 210, however, in other embodiments, the portion may comprise multiple pixels 210.

Contacts 510 may be located on various areas of the device may provide an electrical connection between various elements. For example, the floating diffusion active regions 325(1), 325(2) may comprise contacts 510 for electrically connecting the floating diffusion active regions 325(1), 325(2) to the gate 345 of the amplifier 315 via metal layers and/or wires 405 to form the floating diffusion node 350 (FIG. 3).

The layout may further comprise forming the row select gate 320 in an area adjacent to the amplifier 315, such that the row select gate 320 and the amplifier 315 are electrically coupled.

In an exemplary embodiment, the multi-way shared pixel architecture 300 layout may comprise forming the reset transistor 310 as a multi-branch transistor with more than two source/drain terminals and a multi-branch channel 515 (FIG. 5). The layout may further comprise forming the reset transistor 310 in an area to reduce the overall area utilized by the floating diffusion active regions 325(1), 325(2). Forming the reset transistor 310 as multi-branch transistor with two floating diffusion active regions 325(1), 325(2) may improve the layout efficiency and/or increase the conversion gain of the system.

Referring to FIG. 5, the reset transistor 310 may be formed on a substrate 525, and may comprise an active region 550, wherein the active region 550 comprises multiple doped regions 505(1), 505(2), 505(3). In an exemplary embodiment, the active region 550 comprises a first, second, and third doped regions 505(1), 505(2), 505(3). The doped regions 505(1), 505(2), 505(3) may be formed using any doping techniques or methods. For example, the doped regions 505(1), 505(2), 505(3) may comprise n+ dopants in a p-substrate to form an nMOS transistor or may comprise p+ dopants in an n-doped well to form a pMOS transistor. The doped regions 505(1), 505(2), 505(3) may be defined as the source or drain terminals during operation.

In various embodiments, the third doped region 505(3) may comprise a contact 510 for forming an electrical connection to the voltage source $V_{AA}$ via metal layers and/or wires (not shown).

The reset transistor 310 may further comprise a gate region 500. The gate region 500 may comprise a polysilicon layer and an oxide layer, and may be formed using various materials, processing techniques, and fabrication methods. In various embodiments, the gate region 500 may receive the reset control signal RST. In an exemplary embodiment, the reset transistor 310 comprises only one gate region 500, and when viewed from the top, the gate region 500 does not surround the doped regions 505(1), 505(2), 505(3). Rather, when viewed from the top, the doped regions 505(1), 505(2), 505(3) are formed in areas adjacent to an outer perimeter 530 of the gate region 500. The gate region 500 may overlap an area of each of the doped regions 505(1), 505(2), 505(3) due to the formation process of the doped regions 505(1), 505(2), 505(3).

In an exemplary embodiment, a multi-branch channel 515 may be defined by an area within the same plane and central to the doped regions 505(1), 505(2), 505(3). For example, the doped regions may be disposed in spaced relation to each other and in a semi-circular pattern, where the central area of the semi-circular pattern forms the multi-branch channel 515 with a T-shape. In an alternative embodiment, the doped regions 505(1), 505(2), 505(3) may be disposed in spaced relation to each other and in a circular pattern, where the central area of the circular pattern forms the multi-branch channel 515 with a Y-shape. The number of branches 520 may be equal to the number of doped regions 505. Accordingly, where there are three doped regions 505(1), 505(2), 505(3), the multi-branch channel 515 may have three branches 520(1), 520(2), 520(3), one branch adjacent to each of the doped regions 505(1), 505(2), 505(3).

The reset transistor 310 may further comprise a contact 510 for forming an active region-to-metal connection, or for forming a polysilicon-to-metal connection. The size and location of the contacts 510 may be determined according various processing specifications.

In alternative embodiments, the multi-branch transistor may be utilized in layout designs where it may be advantageous to decrease the area of the floating diffusion region and/or reduce the total number of transistors. For example, the multi-branch transistor may be utilized for an anti-blooming transistor, also known as a photo-diode reset transistor, of a global shutter pixel. In the present embodiment, two of the three doped regions may be coupled to a photosensitive element and the remaining doped region may be coupled to a voltage supply.

The reset transistor 310 may be formed and fabricated using any suitable processing techniques. The following processing steps are illustrative of one embodiment, and fabrication and processing steps may be dictated by the particular processing techniques, chemical selection, desired device characteristics, and the like.

Figure 6A:
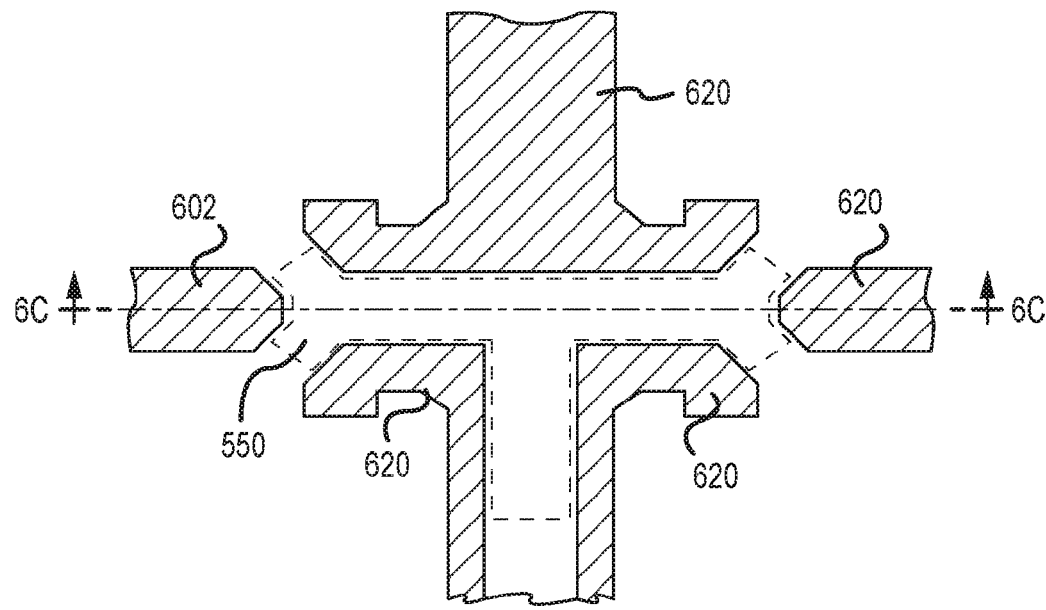
Figure 6B:
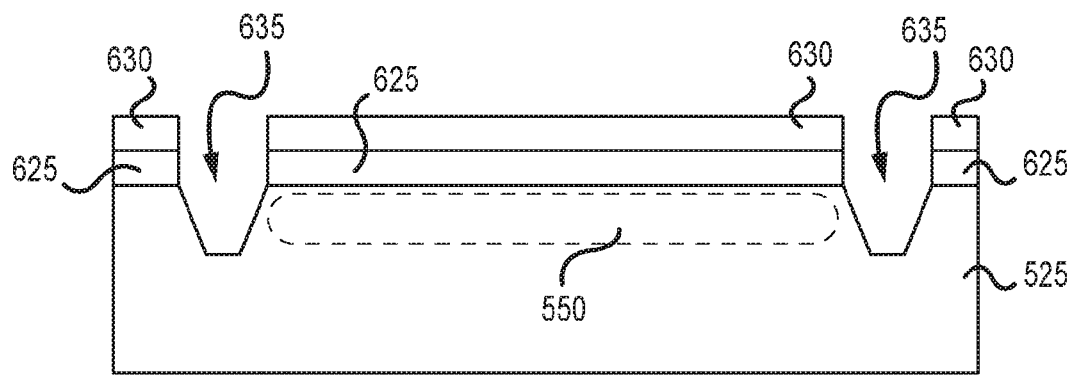
Figure 6C:
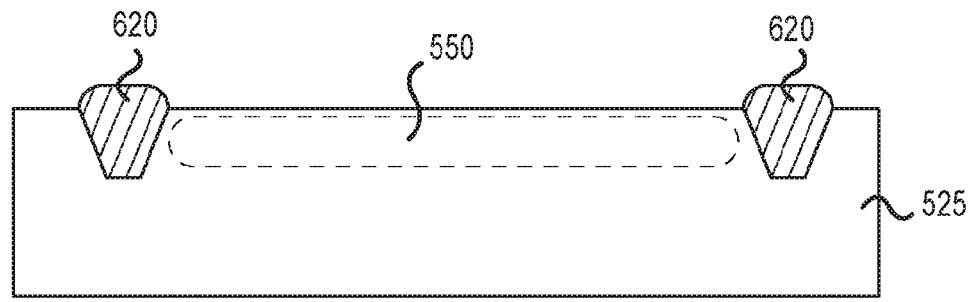

Referring to FIGS. 6A-C, where FIG. 6A is a top view and FIGS. 6B-C are cross-sectional views, isolation regions 620 may be formed, thus defining the active region 550. The isolation regions 620 may be formed using any suitable technique, such as Local Oxidation of Silicon (LOCOS) or Shallow Trench Isolation (STI). For example, a nitride layer 625, such as SiN may be deposited on the substrate 525, for example a silicon wafer, and a photoresist layer 630 may be deposited on top of the nitride layer 625. Photolithography may then be used to pattern and expose the photoresist layer 630. The nitride layer 625 and substrate 525 may then be etched to form trenches 635 where the trenches 635 may be filled in with a deposited oxide. In various embodiments, a mask may be utilized to pattern and form the isolation regions 620 and active region 550. In an exemplary embodiment, the mask may be substantially "T-shaped," however other shapes may be used to produce the same general layout.

Figure 6D:
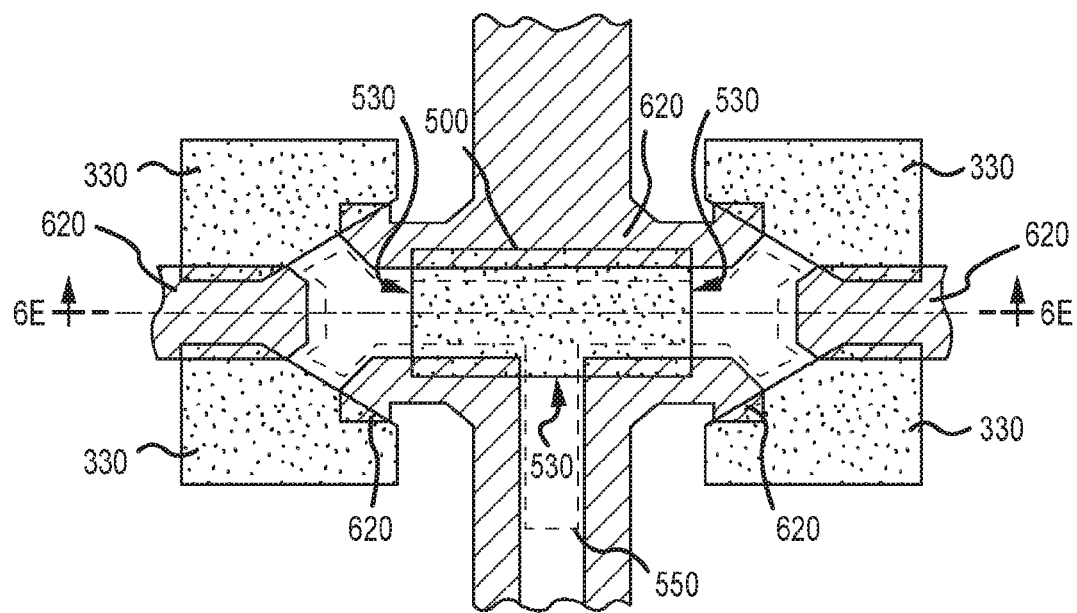
Figure 6E:
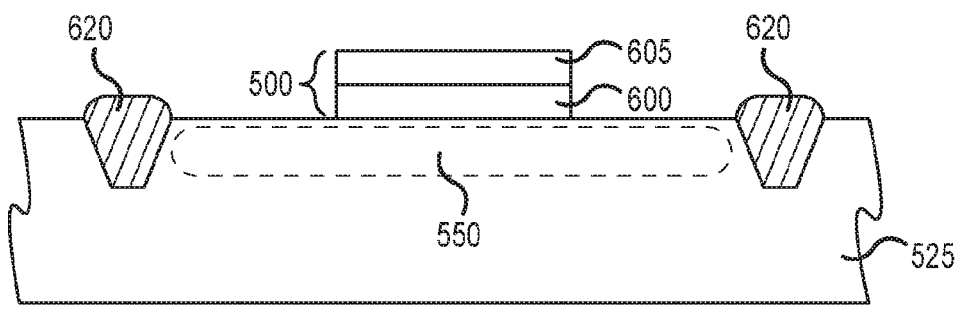

After the isolation regions 620 are formed and the active region 550 is defined, the gate region 500 may be formed. Referring to FIGS. 6D-E, where FIG. 6D is a top view and FIG. 6E is a cross-sectional view, forming the gate region 500 may comprise various processing techniques to form and pattern the gate region 500. In an exemplary embodiment, forming the gate region 500 comprises growing an oxide 600 layer, for example $SiO_2$ on a top surface of the substrate 525, and depositing a polysilicon 605 layer, for example by chemical vapor deposition or furnace deposition. Photolithography and etching, or any other suitable patterning process, may be utilized to pattern the polysilicon 605 and oxide 600 to form the gate region 500.

In an exemplary embodiment, the gate region 500 may comprise solid layers of polysilicon 605 and oxide 600, wherein the polysilicon 605 and oxide 600 are formed in the shape of a quadrilateral, for example, a square or a rectangle. In other words, the gate region 500 may comprise a continuous area of polysilicon 605 overlaying a continuous layer of the oxide 600. In other embodiments, the gate region 500 may be formed in any suitable shape, for example, in shapes comprising more than four sides.

Figure 6F:
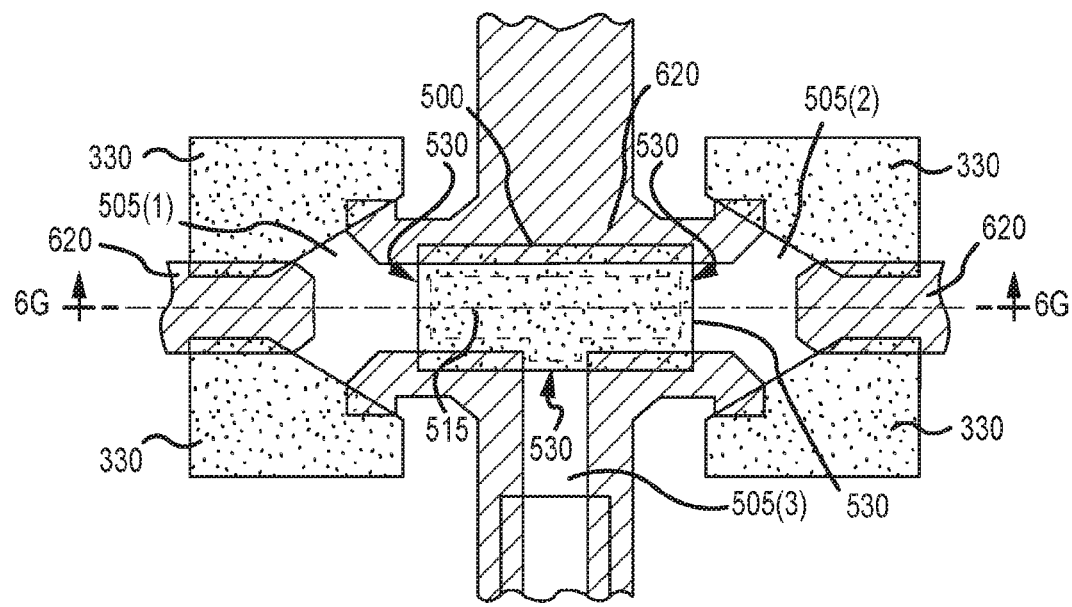
Figure 6G:
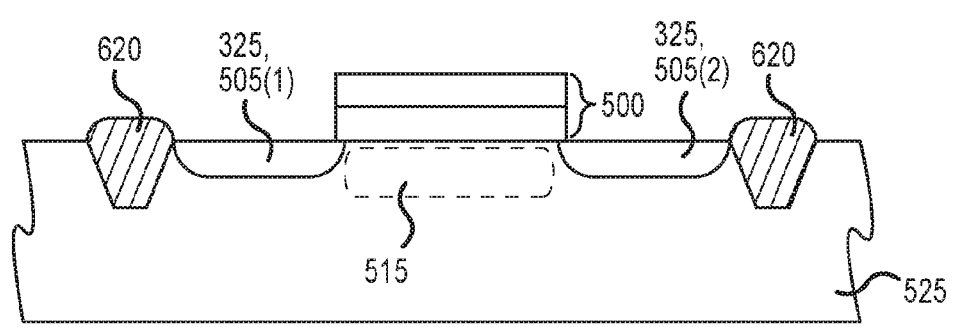

Referring now to FIGS. 6F-G, where FIG. 6F illustrates a top view and FIG. 6G illustrates a cross-sectional view, after the gate region 500 has been patterned, doped regions 505(1), 505(2), 505(3) may be doped by diffusion, ion implantation, or any other suitable methods. Consequently, the channel 515 is defined by the area of substrate 525 underlying the gate region 500 and adjacent to the doped regions 505(1), 505(2), 505(3). According to various embodiments, the channel 515 and doped regions 505(1), 505(2), 505(3) lie substantially in the same plane of the substrate 525, and the channel 515 is substantially surrounded by the doped regions 505(1), 505(2), 505(3). For example, according the present embodiment, each branch 520(1), 520(2), 520(3) of the channel 515 is adjacent to one of the three doped regions 505(1), 505(2), 505(3)

Fabrication may further comprise forming contacts 510 (FIG. 5), and/or metal layers by depositing aluminum or any other suitable metal for forming electrical connections.

In operation, the image sensor 200 may perform the functions of: (1) photon to charge conversion; (2) accumulation of image charge; (3) resetting the floating diffusion active regions 325(1), 325(2) to a known potential; (4) transfer of charge to the floating diffusion active regions 325(1), 325(2); (5) selection of a pixel for readout; and (6) output and amplification of a signal representing a reset level and pixel charge. Photo charge may be amplified when it moves from the initial charge accumulation region to the floating diffusion active regions 325(1), 325(2). The charge at the floating diffusion active regions 325(1), 325(2) are typically converted to a pixel output voltage by the amplifier 315.

During operation, resetting the floating diffusion active regions 325(1), 325(2) to a known potential may comprise activating the reset transistor 310. In an exemplary embodiment, activation of the reset transistor 310, and for purposes of illustration assume the reset transistor 310 is an nMOS transistor, may occur when a sufficient positive voltage is applied to the gate region 500 of the reset transistor 310 and the drain-to-source voltage $V_{DS}$ is greater than zero. The region adjacent to and under the gate region 500 (i.e., the channel 515) may form a conduction path between the source and drain, allowing current to flow from the drain to the source. In an exemplary embodiment, the current flow from the drain, for example the third doped region 505(3), to the source, for example the first doped region 505(1), forms a substantially L-shaped channel. Likewise, current flow from the drain, for example the third doped region 505(2), to the source, for example the second doped region 505(2), forms a substantially L-shaped channel. Activation of the reset transistor 310 resets the floating diffusion regions 325(1), 325(2) to known potential.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

While the technology has been described with reference to specific exemplary embodiments, various modifications and changes may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A solid-state imaging device, comprising:
   a first pixel and a second pixel, wherein each pixel comprises a photosensitive element; and
   a reset transistor, comprising:
      a first gate region comprising an outer perimeter;
      a first doped region, a second doped region, and a third doped region, wherein the doped regions are adjacent to the outer perimeter of the first gate region;
      wherein the first and second doped regions comprise floating diffusion active regions; and
      wherein the first pixel is coupled to the first floating diffusion active region and the second pixel is coupled to the second floating diffusion active region.

2. The solid-state image device of claim 1, wherein the reset transistor further comprises a multi-branch channel defined by an area underlying the first gate region and adjacent to the doped regions, and wherein the multi-branch channel is substantially T-shaped.

3. The solid-state imaging device of claim 1, wherein the first floating diffusion active region is electrically connected to the second floating diffusion active regions.

4. The solid-state imaging device of claim 1, wherein the third doped region of the reset transistor is connected to a supply voltage.

5. The solid-state imaging device of claim 1, further comprising an amplifier comprising a second gate region, wherein the first and second floating diffusion active regions are further electrically coupled to the second gate region.

6. The solid-state imaging device of claim 1, wherein each pixel further comprises a transfer gate, wherein the transfer gate comprises a transistor.

7. The solid-state imaging device of claim 1, further comprising a row select gate, wherein the row select gate comprises a transistor.

8. The solid-state imaging device of claim 1, wherein the first gate region comprises a solid layer of polysilicon.

9. The solid-state imaging device of claim 1, wherein the first and second pixels are separated by the reset transistor.

10. A system, comprising:
    an image sensor comprising:
       a plurality of pixels arranged in a two-dimensional pattern, wherein each pixel comprises a photosensitive element;
       a reset transistor comprising:
          a first gate region comprising an outer perimeter; and
          a first doped region, a second doped region, and a third doped region, wherein the doped regions are adjacent to the outer perimeter of the first gate region;
          wherein the first and second doped regions comprise floating diffusion active regions; and
          wherein a first pixel is coupled to the first floating diffusion active region and a second pixel is coupled to the second floating diffusion active region;
    a central processing unit electrically coupled to the image sensor; and
    a memory device electrically coupled to the central processing unit.

11. The system of claim 10, wherein the first floating diffusion active region is electrically connected to the second floating diffusion active region.

12. The system of claim 11, further comprising an amplifier, wherein the amplifier comprises a second gate region, and wherein the first and second floating diffusion active regions are further electrically coupled to the second gate region.

13. The system of claim 10, further comprising a multi-branch channel defined by an area underlying the first gate region and adjacent to the doped regions, and wherein the multi-branch channel is substantially T-shaped.

14. The system of claim 10, wherein the third doped region of the reset transistor is connected to a supply voltage.

\* \* \* \* \*